United States Patent [19]

Kumanoya et al.

[11] Patent Number: 4,984,210

[45] Date of Patent: Jan. 8, 1991

[54] SEMICONDUCTOR MEMORY DEVICE IMPROVED FOR EXTERNALLY DESIGNATING OPERATION MODE

[75] Inventors: Masaki Kumanoya; Katsumi Dosaka; Yasuhiro Konishi; Takahiro Komatsu; Youichi Tobita, all of Hyogo, Japan

[73] Assignee: Mitsubishi Denki Kabushiki Kaisha, Tokyo, Japan

[21] Appl. No.: 565,400

[22] Filed: Aug. 10, 1990

Related U.S. Application Data

[63] Continuation of Ser. No. 313,558, Feb. 22, 1989.

[30] Foreign Application Priority Data

Aug. 31, 1988 [JP] Japan .................................. 63-218709

[51] Int. Cl.⁵ ......................... G11C 11/40; G11C 13/00
[52] U.S. Cl. ...................................... 365/222; 365/233

[58] Field of Search .................... 365/222, 233, 189.01, 365/189.05, 230.06

[56] References Cited

U.S. PATENT DOCUMENTS 3,737,879 6/1973 Greene et al. ...................... 365/222

Primary Examiner—Terrell W. Fears
Attorney, Agent, or Firm—Lowe, Price, LeBlanc, Becker & Shur

[57] ABSTRACT

In a dynamic random access memory (DRAM), there is provided a refresh decision circuit which detects the external designation of a self refresh mode, in addition to a $\overline{CAS}$ before $\overline{RAS}$ refresh mode, by $\overline{RAS}$ and $\overline{CAS}$ signals. By detecting a time period of one cycle of the $\overline{RAS}$, the self refresh mode is determined. As a result, the timing of change of the $\overline{RAS}$ signal is less restricted.

1 Claim, 5 Drawing Sheets

DETECTION OF THE DESIGNATION OF A READING OR WRITING MODE

DETECTION OF THE DESIGNATION OF A $\overline{CAS}$ BEFORE $\overline{RAS}$ REFRESH MODE

DETECTION OF THE DESIGNATION OF A SELF REFRESH MODE

SEMICONDUCTOR MEMORY DEVICE IMPROVED FOR EXTERNALLY DESIGNATING OPERATION MODE

This application is a continuation application of application Ser. No. 07/313,558, filed Feb. 22, 1989.

BACKGROUND OF THE INVENTION

1. Field of the Invention

The present invention generally relates to a semiconductor memory device and, more particularly, to the designation of its operation mode from the outside. The present invention has particular applicability for externally designating a self refresh mode in a dynamic random access memory.

2. Description of the Background

Recently, personal computers came to be widely used. Particularly at present, a demand for portable personal computers is being increased. A memory device used in such a portable personal computer needs to be backed up by a battery and to have low power consumption As a memory device in such use, a static random access memory or a dynamic random access memory (hereinafter referred to as a DRAM) is used.

In the DRAM, each memory cell comprises one transistor and one capacitor. This is called a one-transistor/one-capacitor type memory cell in which the cell area can be made small so that it is suitable for implementing a high degree of integration.

Since the memory cell comprises one transistor and one capacitor, if the DRAM has been placed in a standby state for a long time, an electric charge stored in the capacitor will be gradually lost due to a junction leak and the like. Therefore, it is necessary to read a stored signal and then rewrite it after a certain period of time. Its operation is called a refresh and there are two modes for performing this operation First is a $\overline{RAS}$ only refresh mode in which the refresh operation is performed by externally applying a $\overline{RAS}$ signal and a row address signal. Second is a $\overline{CAS}$ before $\overline{RAS}$ (automatic) refresh mode in which only $\overline{RAS}$ and $\overline{CAS}$ signals are externally applied and the refresh mode is performed using a signal outputted from an address counter provided inside. Assume that these refresh modes are referred to as a common refresh mode in the following description.

When the DRAM is used in the apparatus having the above mentioned battery backup function, the DRAM should be placed in the standby state while it is backed up by a battery. Therefore, it is necessary to perform the refresh operation at a certain period of time. In order to perform the refresh operation in the above mentioned common refresh mode, it is necessary to control (toggle) the $\overline{RAS}$ and $\overline{CAS}$ signals every cycle. In order to perform the refresh operation in such a common refresh mode while the battery backup is performed, it is necessary to provide a circuit which controls the timing of the $\overline{RAS}$ and $\overline{CAS}$ signals and outputs them, whereby the size of the apparatus becomes large and power consumption is increased.

In order to solve this problem, a DRAM having a self refresh mode was proposed and is commercially available. One example of the self refresh mode is disclosed in, for example a paper entitled "A 64K bit MOS Dynamic RAM having an Automatic/Self Refresh Function" by Yamada et al. (pp. 62 to 69, No. 1, J66-C Vol., in January 1983 of Journal of Institute of Electronics and Communication Engineers of Japan).

FIG. 4 is a block diagram showing one example of a conventional DRAM having a self refresh mode. Referring to FIG. 4, the DRAM comprises a memory cell array 97 including memory cells, an address buffer 96 for temporarily storing an address signal, and a row decoder 98 for decoding the address signal An address switching circuit 95 is connected to receive external address signals $A_0$ to $A_7$ and refresh address signals $Q_0$ to $Q_6$ generated inside and outputs either address signal to the address buffer 96 in response to a refresh control circuit 92. A detection circuit 91 is provided for detecting the self refresh mode and the refresh control circuit 92 operates a timer 93 and a refresh address counter 94 in response to the detection of the self refresh mode.

In operation, if an external $\overline{RAS}$ signal at a high level is applied (in the standby state) and an external refresh signal $\overline{REF}$ continues to remain at a low level more than a predetermined time (maximum is 16μs), the designation of the self refresh mode is detected by the circuit 91. The refresh control circuit 92 operates the timer 93 in response to this detection. The timer 93 outputs a signal to the refresh address counter 94 through the circuit 92 at least every 16μs. The refresh address signals $Q_0$ to $Q_6$ outputted from the counter 94 are applied to the row decoder through the address switching circuit 95 and the address buffer 96. The row decoder 98 decodes the signals $Q_0$ to $Q_6$, a word line in the memory array 97 is sequentially selected and a data signal stored in the memory cell is refreshed. As long as the signal $\overline{REF}$ remains at a low level, the refresh operation in the self refresh mode is continued.

FIG. 5A is a block diagram showing another example of a conventional DRAM having the self refresh mode. FIG. 5B is a timing chart for describing its operation. These figures are disclosed in Japanese Patent Laying-Open Gazette No. 57097/1986.

Referring to FIG. 5A, it should be noted that the external refresh signal $\overline{REF}$ is not required when the self refresh mode is externally designated in this DRAM. That is, a refresh timing generation circuit 25 connected to a timer 24 detects the self refresh mode in response to the $\overline{RAS}$ signal More specifically, as shown in FIG. 5B, after the refresh timing generation circuit 25 detects the $\overline{CAS}$ before $\overline{RAS}$ refresh mode, it detects that the $\overline{RAS}$ signal remains at a low level more than a predetermined period of time and, then the designation of the self refresh mode is determined. The refresh operation after the recognition of the self refresh mode is the same as that of the DRAM shown in FIG. 4, so that the description thereof is omitted.

The DRAM shown in FIG. 4 is not preferable because it needs a terminal receiving the external refresh signal $\overline{REF}$ for designating the self refresh mode. In addition, the DRAM shown in FIG. 5A has a problem in which the timing of the $\overline{CAS}$ before $\overline{RAS}$ refresh to be defined is limited because the self refresh mode is detected by the $\overline{RAS}$ signal.

A further example of a prior art of interest to the present invention is seen in U.S. Pat. No. 4,636,989 filed 13 Jan. 1987 on behalf of Ikuzaki, entitled "Dynamic MOS Random Access Memory". This prior art, discloses the DRAM which starts refresh operation if the $\overline{RAS}$ signal remains at a high level more than a predetermined period of time. This example is not preferred as described above because a timing of change of the externally applied $\overline{RAS}$ signal is limited.

SUMMARY OF THE INVENTION

An object of the present invention is to provide a semiconductor memory device in which a timing of change of an external control signal generated for designating an operation mode is less limited.

It is another object of the present invention to provide a dynamic random access memory in which a timing of change of an external control signal generated for designating an operation mode is less limited.

It is a further object of the present invention to provide a dynamic random access memory in which a timing of change of a row address strobe signal generated for externally designating a self refresh mode is less limited.

In brief, a semiconductor memory device in accordance with the present invention comprises a cycle time comparison circuit which compares a time period of one cycle of an externally applied control signal with a time period of a predetermined memory cycle and a circuit operating the semiconductor memory device in either a first or a second operation mode in response to the result of the comparison.

In operation, the designation of the first or second operation mode is detected in response to the time period of one cycle of the externally applied control signal. If the control signal changes within one cycle, it is not restricted by the timing of change of a signal level when the operation mode is designated.

Referring to a preferred embodiment, the semiconductor memory device comprises a dynamic random access memory device When a time period of one cycle of a row address strobe signals detected, it is determined that the self refresh mode was externally designated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
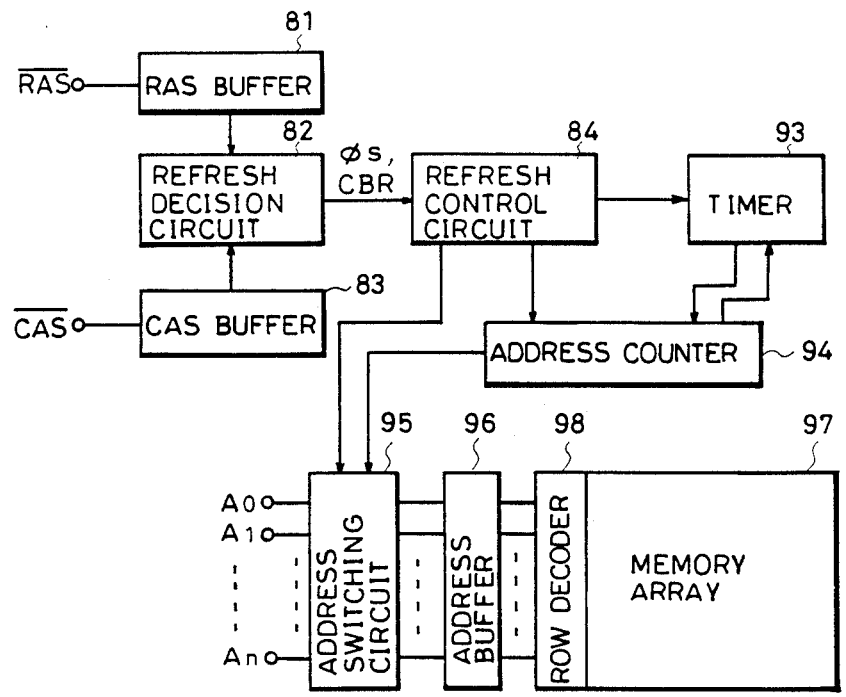
FIG. 1 is a block diagram showing a DRAM in accordance with one embodiment of the present invention.
Figure 4:
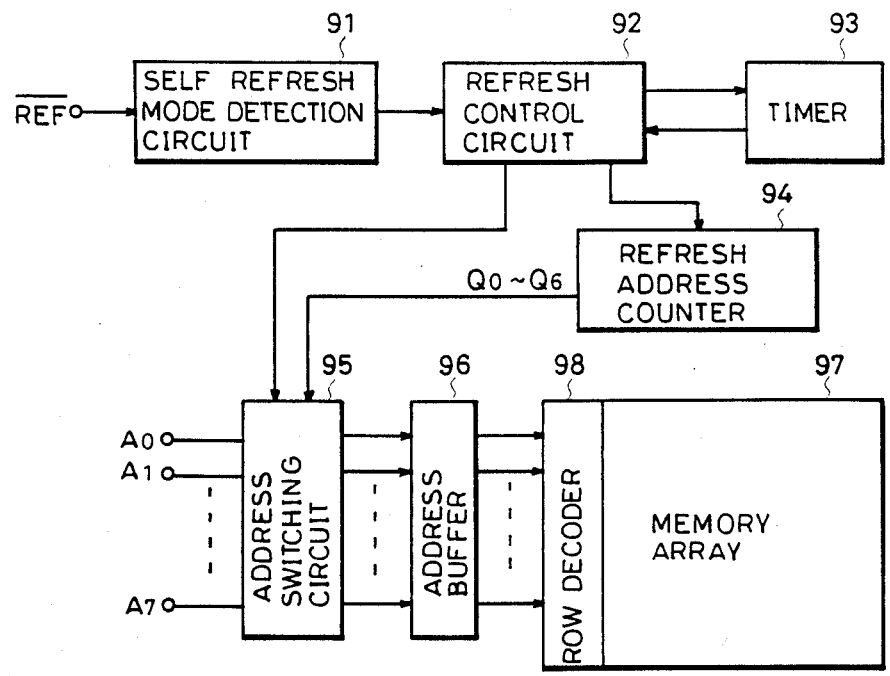
FIG. 4 is a block diagram showing one example of a conventional DRAM.

FIG. 1 is a block diagram showing a DRAM in accordance with one example of the present invention. Referring to FIG. 1, the DRAM is different from the DRAM shown in FIG. 4 in that a refresh decision circuit 82 is connected such that this DRAM receives $\overline{RAS}$ and $\overline{CAS}$ signals. The refresh decision circuit 82 is connected to receive the $\overline{RAS}$ signal through a RAS buffer 81 and also connected to receive the $\overline{CAS}$ signal through a CAS buffer 83. When the designation of the self refresh mode is detected, a signal $\phi s$ is outputted from the refresh decision circuit 82. When the designation of the common refresh mode, for example, the $\overline{CAS}$ before $\overline{RAS}$ refresh mode is detected, a signal CBR is outputted from the circuit 82. The refresh control circuit 84 controls the refresh operation or the $\overline{CAS}$ before $\overline{RAS}$ refresh operation in response to the signal $\phi s$ or CBR.

Figure 2A:
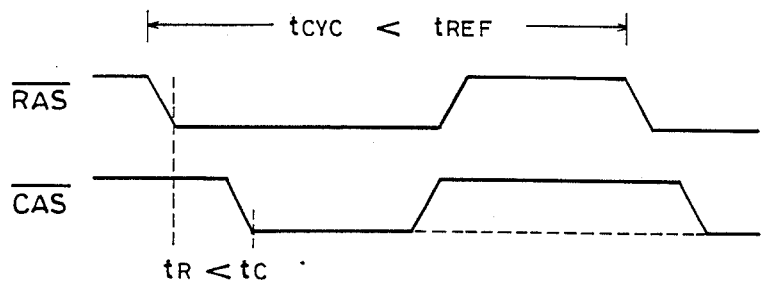
FIGS. 2A to 2C are timing charts for describing an operation of a refresh decision circuit shown in FIG. 1.
Figure 2B:
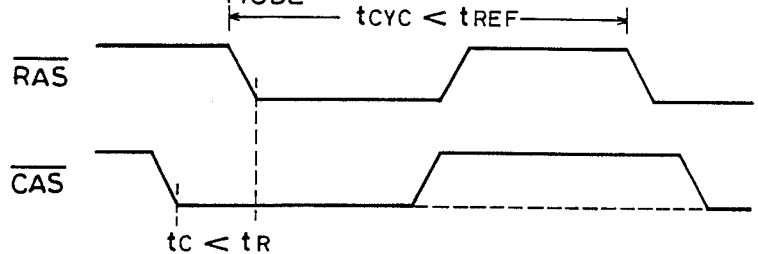
Figure 2C:
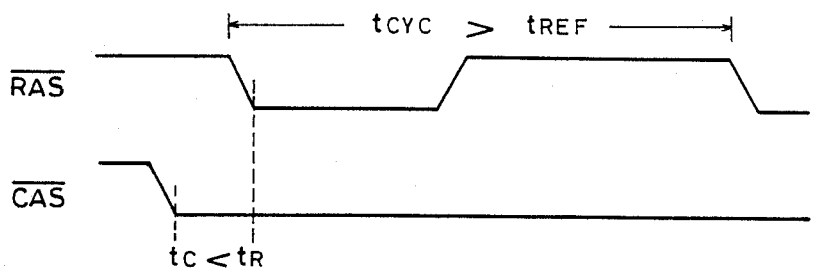

FIGS. 2A to 2C are timing charts for describing an operation of the refresh decision circuit 82 shown in FIG. 1. In each figure, the changes of the $\overline{RAS}$ and $\overline{CAS}$ signals are shown. Time points $t_R$ and $t_C$ show the timing when the $\overline{RAS}$ signal and $\overline{CAS}$ signals fall, respectively FIG. 2A is the timing chart showing when the designation of the common read or write mode is detected. The $\overline{RAS}$ signal falls at the time $t_R$ and then the $\overline{CAS}$ signal falls at the time $t_C$. The refresh decision circuit 82 detects the timing when these signals change and detects the designation of the read or write mode.

FIG. 2B is the timing chart showing when the $\overline{CAS}$ before $\overline{RAS}$ refresh mode is detected. In this case, the $\overline{CAS}$ signal falls at the time $t_C$ and then $\overline{RAS}$ signal falls at the time $t_R$. By detecting the timing when these signals change, the decision circuit 82 determines that the $\overline{CAS}$ before $\overline{RAS}$ refresh mode was designated. In addition, for the detection of the mode shown in FIGS. 2A and 2B, time required for one memory cycle, that is, time period $t_{cyc}$ from the time when the $\overline{RAS}$ signal falls to the time when the $\overline{RAS}$ signal falls again is less than a predetermined maximum refresh time $t_{REF}$.

FIG. 2C is the timing chart showing when the designation of the self refresh mode is detected In this case, as in case of the $\overline{CAS}$ before $\overline{RAS}$ refresh mode, the $\overline{RAS}$ signal falls the after the $\overline{CAS}$ signal falls. In addition, the decision circuit 82 detects when the memory cycle time $t_{cyc}$ exceeds a predetermined refresh time $t_{REF}$. As a result, the self refresh mode is determined.

Figure 3A:
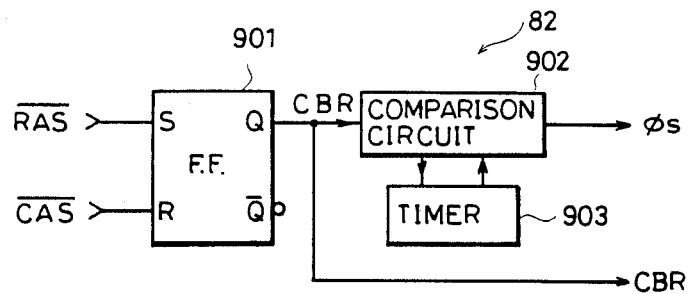
FIG. 3A is a block diagram showing one example of the refresh decision circuit shown in FIG. 1.
Figure 3B:
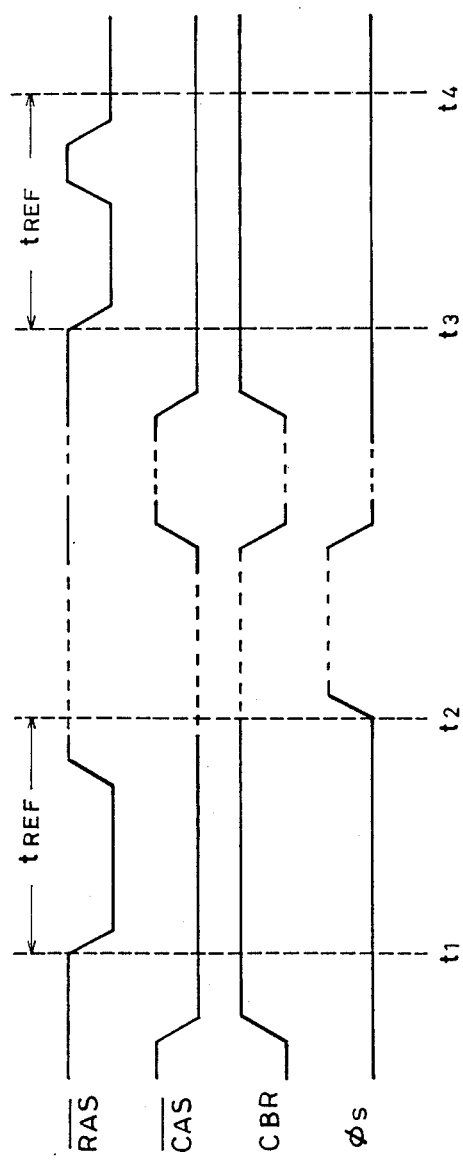
FIG. 3B is a timing chart for describing an operation of a circuit shown in FIG. 3A.

FIG. 3A is a block diagram showing one example of the refresh decision circuit 82 shown in FIG. 1. FIG. 3B is a timing chart for describing its operation. Referring to FIG. 3A, the decision circuit 82 comprises a SR flip-flop 901 having its set input and reset input connected to receive a $\overline{RAS}$ signal and a $\overline{CAS}$ signal, respectively, a comparison circuit 902 connected to one output of the flip-flop 901 and a timer 903 connected to the comparison circuit 902.

In operation, the flip-flop 901 is set in response to the $\overline{RAS}$ signal at a high level and the $\overline{CAS}$ signal at a low level and, then a signal CBR at a high level is outputted. The refresh control circuit 84 starts a $\overline{CAS}$ before $\overline{RAS}$ refresh control in response to the signal CBR. In addition, the timer 903 operates in response to the signal CBR and the comparison circuit 902 outputs a signal $\phi s$ at a high level (time t2) if the signal CBR remains at a high level beyond a predetermined time $t_{REF}$. The refresh control circuit 84 starts a self refresh control in response to the signal $\phi s$. Thereafter, when the $\overline{CAS}$ signal changes to a high level, the flip-flop 901 is reset and the signals CBR and $\phi s$ change to a low level In this way, the designation of the self refresh mode is detected.

Figure 5A:
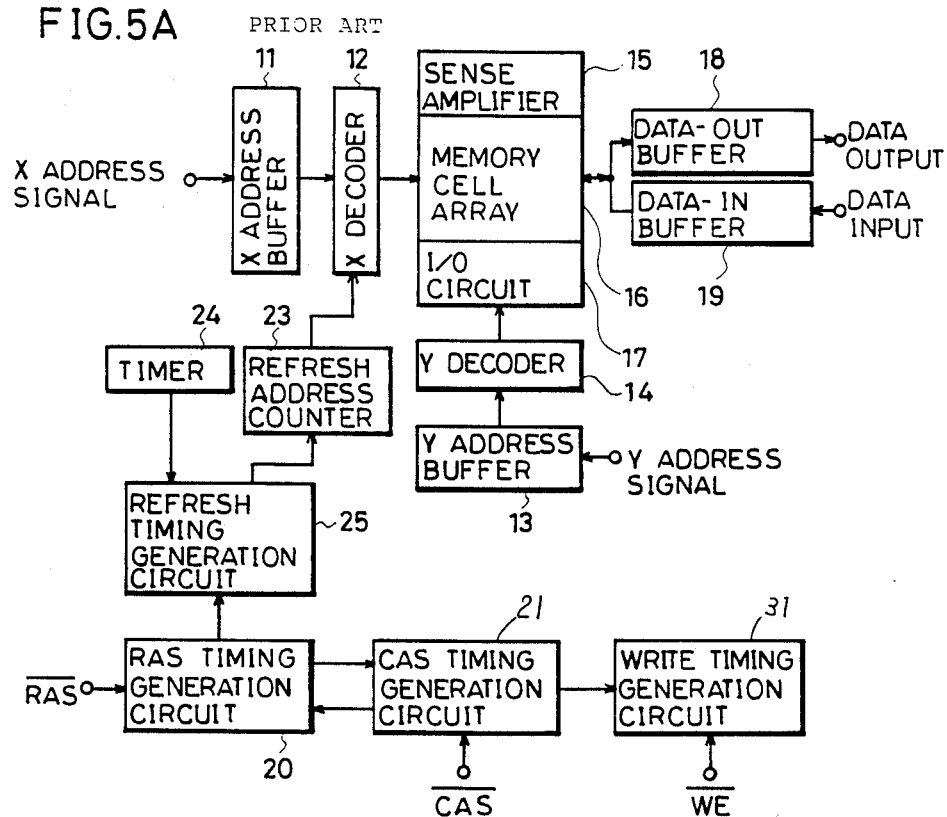
FIG. 5A is a block diagram showing another example of a conventional DRAM.
Figure 5B:
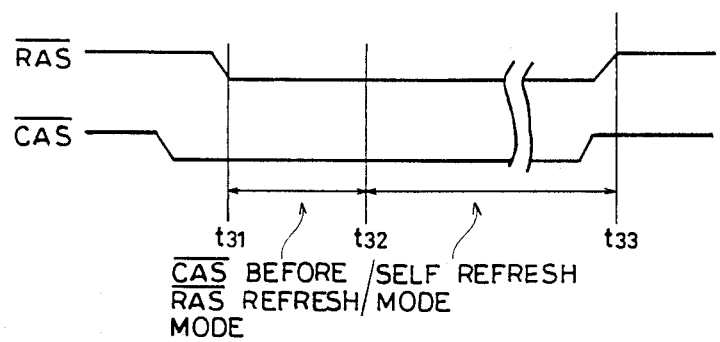
FIG. 5B is a timing chart for describing operation of the refresh timing generation circuit shown in FIG. 5A.

As a result, when the operation in the self refresh mode is not required, it is possible to obtain a DRAM which has no restriction to the timing of change of the $\overline{RAS}$ signal and is easier to handle than the DRAM shown in FIG. 5A.

According to the above described embodiment, in the DRAM having the $\overline{CAS}$ before $\overline{RAS}$ refresh mode, the designation of the self refresh mode is detected by comparing the cycle time $t_{cyc}$ in the $\overline{CAS}$ before $\overline{RAS}$ refresh operation with the predetermined value $t_{REF}$ of the refresh time. The present invention is not limited to this DRAM and applicable to a general semiconductor memory device. More specifically, it can be applied to a semiconductor memory device which starts another operation mode by detecting an external control signal having a cycle time which is beyond a predetermined cycle time in a certain operation mode. As a result, in the semiconductor memory device, since the designation of the operation mode can be detected in response to the time period of one cycle of the external control signal, the timing of change of the control signal can be less restricted.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device operating in at least first and second operation modes comprising:

means for receiving at least one variable length control signal to externally control said memory device, said control signal having at least one cycle period;

operation means for operating said memory device in response to said control signal; and cycle time comparing means for comparing a time period of one cycle of said control signal with a predetermined time period of a memory cycle, said operating means operating said memory device in either said first or second operation mode in response to the result of the comparison by said cycle time comparing means.

* * * * *